United States Patent
Yasui

(10) Patent No.: US 7,861,386 B2
(45) Date of Patent: Jan. 4, 2011

(54) METHOD FOR PRODUCING PIEZOELECTRIC ACTUATOR AND METHOD FOR PRODUCING INK-JET HEAD

(75) Inventor: Motohiro Yasui, Nagoya (JP)

(73) Assignee: Brother Kogyo Kabushiki Kaisha, Nagoya-Shi, Aichi-Ken (JP)

(*) Notice: Subject to any disclaimer, the term of this patent is extended or adjusted under 35 U.S.C. 154(b) by 57 days.

(21) Appl. No.: 11/232,428

(22) Filed: Sep. 22, 2005

(65) Prior Publication Data

US 2006/0090337 A1 May 4, 2006

(30) Foreign Application Priority Data

Sep. 22, 2004 (JP) ............... 2004-275919

(51) Int. Cl.
*H01L 41/22* (2006.01)
(52) U.S. Cl. .............. 29/25.35; 29/890.1; 427/100; 427/376.2; 427/380; 427/427
(58) Field of Classification Search ............... 29/890.1, 29/25.35; 427/372.2, 100, 376.2, 380, 421.1–427.7
See application file for complete search history.

(56) References Cited

U.S. PATENT DOCUMENTS

| 5,374,578 A * | 12/1994 | Patel et al. ............. 438/3 |
| 6,194,818 B1 * | 2/2001 | Sumi et al. ............. 310/311 |
| 7,229,160 B2 * | 6/2007 | Kobayashi ............. 347/68 |
| 2005/0231073 A1 * | 10/2005 | Sugahara et al. ............. 310/328 |

FOREIGN PATENT DOCUMENTS

| JP | 8-230181 | 9/1996 |
| JP | 11-314365 | 11/1999 |
| JP | 2000-94681 | 4/2000 |
| JP | 2001-152360 | 6/2001 |

OTHER PUBLICATIONS

Araújo, E. B., Effects of crystallization conditions on dielectric and ferroelectric properties of PZT films, Jul. 31, 2003 Journal of Physics D: Applied Physics, vol. 36, pp. 2010-2013.*

* cited by examiner

*Primary Examiner*—A. Dexter Tugbang
*Assistant Examiner*—Livius R Cazan
(74) *Attorney, Agent, or Firm*—Banner & Witcoff, Ltd.

(57) ABSTRACT

In the annealing step of the method for manufacturing a piezoelectric actuator, the annealing in conducted in two steps: a first annealing step; and a second annealing step conducted at a temperature lower and for a time longer than those of the first annealing step. With such treatment, first, grain growth inside the piezoelectric film can be sufficiently induced, while minimizing the diffusion layer growth, by the first annealing step conducted at a high temperature within a short interval, and then lattice defects in the particles can be sufficiently corrected, while preventing the diffusion layer growth, by the second annealing step conducted at a temperature lower and for a time longer than those of the first annealing step. Accordingly, the piezoelectric characteristic can be improved by sufficiently conducting annealing, while restricting the thickness of the diffusion layer to a range where the piezoelectric characteristic is not affected.

20 Claims, 7 Drawing Sheets

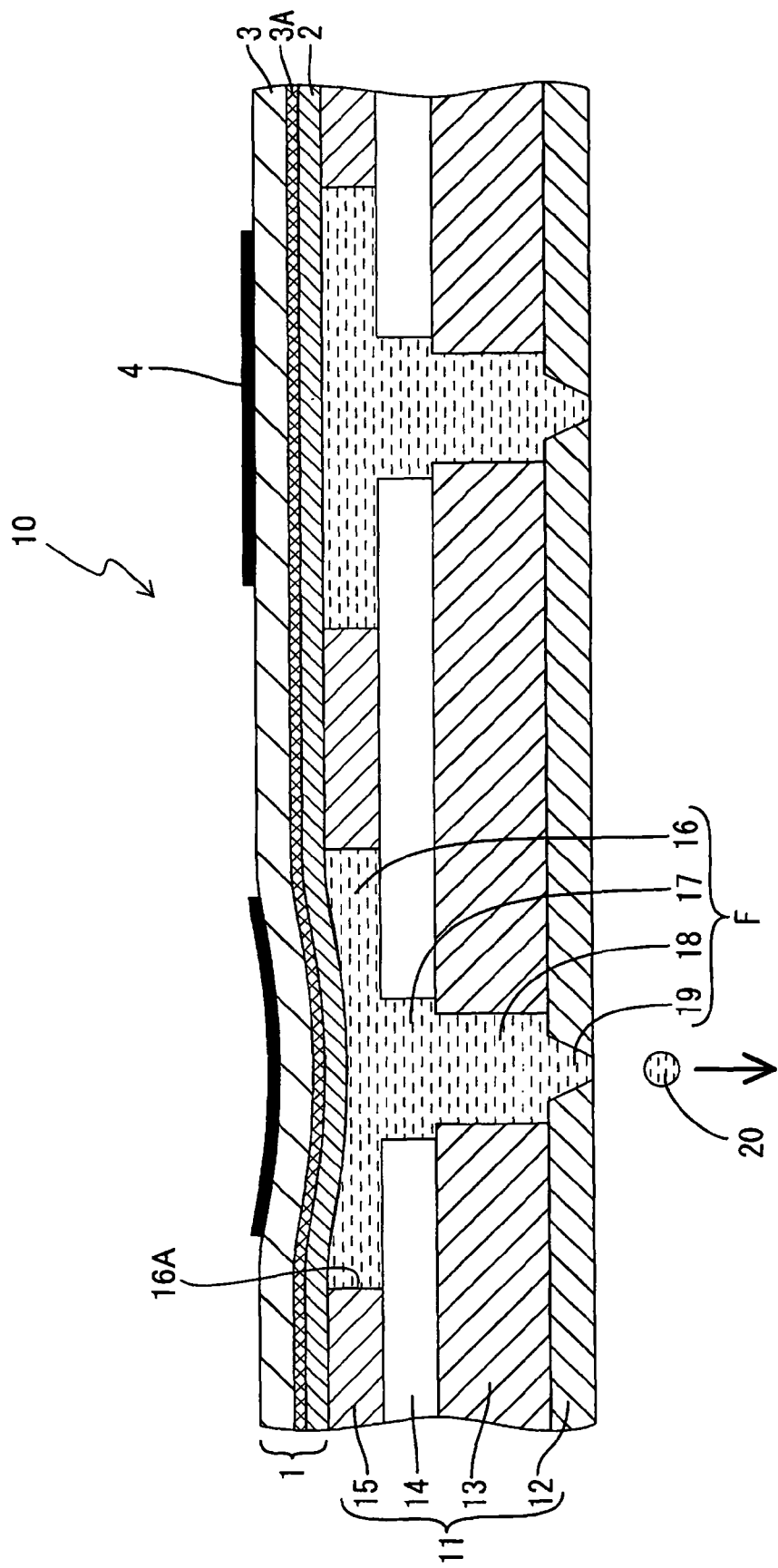

SEM IMAGE

AES ANALYSIS

METHOD FOR PRODUCING PIEZOELECTRIC ACTUATOR AND METHOD FOR PRODUCING INK-JET HEAD

BACKGROUND OF THE INVENTION

1. Field of the Invention

The present invention relates to a method for manufacturing a piezoelectric actuator and an ink-jet head.

2. Description of the Related Art

An example of a piezoelectric actuator for an ink-jet head is disclosed in Japanese Patent Application Laid-open No. 11-314365. This piezoelectric actuator comprises a substrate (elastic film) provided so as to close the openings in pressure chambers communicated with nozzle openings in a channel forming body of the ink-jet head and has a structure in which a lower electrode, a piezoelectric film, and an upper electrode are laminated in this order on the substrate. When an electric field is applied between the lower electrode and upper electrode, the substrate bends by the deformation of the piezoelectric film, a pressure is applied to the ink present inside the pressure chambers, and the ink is discharged from the nozzle openings.

A method called an aerosol deposition method (AD method), such as described, for example, in Japanese Patent Application Laid-open No. 2001-152360 has been suggested as a method for the manufacture of the above piezoelectric actuators. In this method, a dispersion (aerosol) of fine particles of a piezoelectric material such as lead zirconium titanate (PZT) in a gas is ejected toward a substrate surface and a piezoelectric film (piezoelectric layer) is formed by collisions of the fine particles with the substrate and deposition thereonto.

In the above-described AD method, the particles blown on the substrate collide with the substrate and adhere thereto, while being crushed. Therefore, a piezoelectric film having a sufficient piezoelectric characteristic cannot be obtained by the size reduction of the particles and occurrence of lattice defects due to collisions. For this reason, the piezoelectric film has to be subjected to annealing in order to obtain a piezoelectric characteristic necessary to bend the substrate sufficiently. However, when the inventor actually formed a piezoelectric layer on a substrate by the AD method and then conducted annealing, the piezoelectric characteristic degraded.

SUMMARY OF THE INVENTION

The present invention has been made in view of the above-mentioned situations. An object of the present invention is to provide a method for manufacturing a piezoelectric actuator and an ink-jet head capable of improving the piezoelectric characteristic.

According to a first aspect of the present invention, there is provided a method for manufacturing a piezoelectric actuator provided with a substrate and a piezoelectric film formed on the substrate, the method including the steps of:

forming the piezoelectric film by blowing an aerosol containing particles of a piezoelectric material on a surface of the substrate to adhere the particles to the substrate; and annealing the piezoelectric film, wherein the step of annealing includes a first annealing step and a second annealing step conducted after the first annealing step and having an annealing temperature lower and an annealing time longer than those of the first annealing step.

The inventor has conducted a comprehensive study with the object of providing the method for manufacturing the piezoelectric actuator and the ink-jet head enabling the improvement of the piezoelectric characteristic, and the inventor found the following.

It was found that when annealing is conducted at a high temperature in order to obtain a piezoelectric actuator having a high piezoelectric characteristic, elements contained in the substrate mainly diffuse into the piezoelectric film (piezoelectric film), thereby degrading the piezoelectric characteristic of the piezoelectric actuator. In recent years, there is a demand to use the inexpensive stainless steel having excellent machinability as a substrate of piezoelectric actuators, but because stainless steel contains elements such as Fe that can easily diffuse into the piezoelectric film, this diffusion becomes a significant problem. Examples illustrating how the elements contained in the substrate diffuse into the piezoelectric film (piezoelectric layer) are shown in FIGS. 6 to 8.

The evaluation results in FIGS. 6 to 8 show a cross section in the vicinity of the interface between the substrate and piezoelectric layer observed in the case where annealing was conducted for an annealing time of 5 min (minutes) at an annealing temperature of 800° C. after forming a piezoelectric layer composed of PZT on a SUS substrate. The film thickness of the piezoelectric layer was 13 µm. FIG. 6 shows a SEM image, FIG. 7 shows an AES analysis result, and FIG. 8 shows a distribution of atomic concentration in the vicinity of the interface between the substrate and piezoelectric layer. As shown in FIG. 6 and FIG. 7, in an interface of the piezoelectric layer on a side of the substrate, a diffusion layer (the region with dark color in FIGS. 6 and 7) is formed by diffusion of elements contained in the substrate. The results in FIGS. 6 and 7 show that the thickness of the diffusion layer is about 0.9 µm.

In addition, FIG. 8 shows the distribution of atomic concentration of the elements in the arrow direction (direction from the piezoelectric layer toward the substrate) in FIG. 7. As shown in FIG. 8, there is a peak of atomic concentration of Fe contained in the substrate. Furthermore, a peak of atomic concentration of Cr contained in the substrate is present in the piezoelectric layer across the diffusion layer. Namely, the results in FIG. 8 demonstrate that Fe and Cr contained in the substrate diffuse into the piezoelectric layer by the annealing treatment. Furthermore, in the example shown in FIG. 8, the peak of Pb contained in the piezoelectric layer is present in the vicinity of a substrate surface on a side of the diffusion layer. Therefore, FIG. 8 indicates that Pb contained in the piezoelectric layer slightly diffuses into the substrate by the annealing treatment.

The diffusion layer formation process is described below. When a piezoelectric film is exposed to high-temperature environment by annealing, the easily diffusing elements contained in the substrate diffuse gradually into the piezoelectric film and a diffusion layer is formed on the interface between the piezoelectric film and the substrate. As the annealing time becomes longer, this diffusion layer grows gradually in the thickness direction of the piezoelectric film. However, when the inventor further studied the relationship between the diffusion layer and piezoelectric characteristic, the inventor has found that the degradation of piezoelectric characteristic caused by this diffusion depends on the ratio of the thickness of the diffusion layer to the thickness of the entire piezoelectric film and when the ratio ($L_1/L_2$) of the thickness $L_2$ of the diffusion layer to the thickness $L_1$ of the entire piezoelectric film is about 0.02 or less, a piezoelectric characteristic of 80-90% or more of that without the diffusion can be ensured.

Accordingly, the inventor has conducted a comprehensive study of annealing conditions for obtaining a sufficient piezoelectric characteristic, while minimizing the thickness of the diffusion layer. Here, the growth of piezoelectric body grain and correction of lattice defects (slip, stacking faults, dislocations) resulting from impact shock occurring when the blown particles collide on the substrate during film formation are necessary to improve the piezoelectric characteristic. In this case, the annealing treatment has to be conducted under certain high-temperature conditions to provide for grain growth. On the other hand, the annealing treatment has to be conducted at a constant temperature and the annealing treatment has also to be conducted during a certain recovery period to correct the lattice defects. Accordingly, the inventor found that in the initial stage of annealing, the treatment is conducted for a short time at a high temperature to ensure grain growth, and then the lattice defects presenting the crystal can be corrected by conducting annealing for a certain time at a certain low temperature at which diffusion can be inhibited. The present invention is based on this finding.

In the first annealing step, the annealing temperature may be high and the annealing time may be short to ensure sufficient grain growth within a range in which the diffusion layer does not grow to a thickness adversely affecting the piezoelectric characteristic. More specifically, the annealing temperature may be not less than 700° C. and the annealing time may be not more than 3 min, more preferably the annealing temperature may be not less than 800° C. and the annealing time may be not more than 2 min. When the annealing time is extremely short, sufficient grain growth might not proceed inside the piezoelectric film. Therefore, the annealing time may be not less than 1 min.

In the second annealing step, annealing may be conducted for a sufficient time and at a low temperature such that the diffusion does not proceed significantly, in order to conduct a sufficient correction of lattice defects inside the piezoelectric film. More specifically, the annealing temperature may be not more than 700° C. and the annealing time may be not less than 10 min, more preferably the annealing temperature may be not more than 650° C. Further, in the second annealing step, it is not necessary that the annealing temperature be constant from the start to the end and, for example, the annealing temperature may be decreased gradually during the annealing treatment. Furthermore, when the annealing temperature is very low, the sufficient correction of lattice defects might not be conducted. Therefore, the annealing temperature may be not less than 500° C. Furthermore, the annealing time in the second annealing step varies depending on the annealing temperature. However, when the annealing time is extremely long, the diffusion proceeds significantly and the piezoelectric characteristic degrades. Therefore, the annealing time may be not more than 30 min.

In addition, in the first annealing step, the temperature of the treatment atmosphere may be raised to the predetermined annealing temperature as fast as possible after the annealing is started in order to cause the necessary grain growth as short a time as possible. More specifically, the temperature may be raised at a temperature rise rate of not less than 800° C./min. Furthermore, in the first annealing step, the substrate can be placed into the treatment atmosphere after the temperature of the treatment atmosphere previously has been raised to the annealing temperature.

The annealing treatment may be conducted, for example, by loading the substrate with the piezoelectric film formed thereon into an electric furnace. Furthermore, the annealing treatment may be conducted by using an infrared lamp or a $CO_2$ laser having a wavelength in the absorption band of the piezoelectric material and irradiating with infrared rays or laser beam at an irradiation intensity such that the temperature of the piezoelectric film becomes the predetermined temperature.

In the method for manufacturing the piezoelectric actuator in accordance with the present invention, the substrate may be a metallic substrate. In particular, the substrate may contain at least one element selected from the group consisting of Cr, Fe, Ti, and Si. Furthermore, in the method for manufacturing a piezoelectric actuator in accordance with the present invention, the piezoelectric material may be PZT.

According to the second aspect of the present invention, there is provided a method for manufacturing an ink-jet head, the ink-jet head provided with an ink channel forming body having a plurality of pressure chambers each of which is provided with an opening in one surface side thereof and communicated with an ink discharge nozzle for discharging an ink and a piezoelectric actuator having a vibration plate provided in the one surface side of the ink channel forming body to close the openings in one surface side of the ink channel forming body and a piezoelectric film formed on the vibration plate, the method including the steps of:

forming the piezoelectric film by blowing an aerosol containing particles of a piezoelectric material on the surface of the vibration plate to adhere the particles to the substrate; and annealing the piezoelectric film, wherein the annealing step includes a first annealing step and a second annealing step conducted after the first annealing step and having an annealing temperature lower and an annealing time longer than those of the first annealing step.

The method for manufacturing the ink-jet head in accordance with the present invention can further include, prior to the step of forming the piezoelectric film, the steps of: forming the ink channel forming body and joining the vibration plate to the ink jet forming body.

In the method for manufacturing the piezoelectric actuator and the ink-jet head in accordance with the present invention, the annealing treatment of the piezoelectric actuator is conducted in two steps: the first annealing step and the second annealing step conducted at a temperature lower and for a time longer than those of the first annealing step. With such treatment, grain growth inside the piezoelectric film can be sufficiently induced, while minimizing the diffusion layer growth, by the first annealing step conducted at a high temperature within a short interval, and then lattice defects in the piezoelectric film can be sufficiently corrected, while inhibiting the diffusion layer growth, by the second annealing in which the piezoelectric film is annealed at a low temperature and for a long time. Therefore, in the method for manufacturing the piezoelectric actuator and ink-jet head in accordance with the present invention, the piezoelectric characteristic can be sufficiently improved, while minimizing the growth of diffusion layer in the piezoelectric film.

Furthermore, when the temperature is raised as fast as possible to the annealing temperature in the first annealing step in accordance with the present invention, or when the temperature of the treatment atmosphere is previously raised to the annealing temperature and then the substrate is placed into the treatment atmosphere and annealing is conducted, the annealing treatment can be conducted at a high temperature enabling grain growth in the piezoelectric film for as long a time as possible within a range in which the diffusion layer is reduced to a minimum. Therefore, the piezoelectric characteristic can be sufficiently improved.

BREIEF DESCRIPTION OF THE DRAWINGS

FIG. 1 is a side sectional view illustrating the ink-jet head of the present embodiment.

FIGS. 2A to 2D illustrate the process for manufacturing the actuator plate of the present embodiment. FIG. 2A is a cross-sectional view showing how the vibration plate is joined to the pressure chamber plate. FIG. 2B is a cross-sectional view showing how a piezoelectric layer is formed. FIG. 2C is a cross-sectional view showing the piezoelectric layer after annealing. FIG. 2D is a cross-sectional view showing how the upper electrodes are formed.

FIG. 3 is a schematic drawing of a film forming device.

FIGS. 4A to 4C are graphs illustrating the relationship between the annealing time and piezoelectric characteristic. FIG. 4A is a graph illustrating the relationship between the annealing time and piezoelectric characteristic in the case where the piezoelectric film is not affected by diffusion. FIG. 4B is a graph illustrating the relationship between the diffusion rate of metal elements into the piezoelectric film and the annealing time. FIG. 4C is a graph illustrating the relationship between the annealing time and piezoelectric characteristic in the case where the piezoelectric film is affected by diffusion.

BEST MODE FOR CARRYING OUT THE INVENTION

Figure 2A:
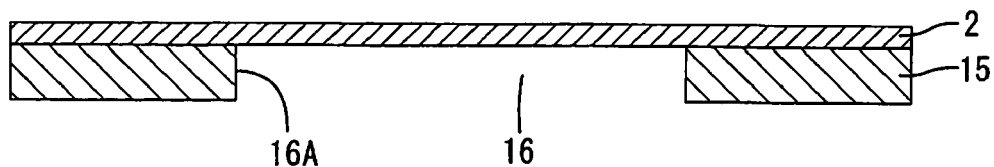

A specific embodiment of the present invention will be described below with reference to FIG. 1 to FIG. 4. The present embodiment illustrates an example of applying the present invention to manufacturing a piezoelectric actuator for an ink-jet head.

FIG. 1 shows an ink-jet head 10 of the present embodiment. The ink-jet head 10 includes a channel unit 11 having a plurality of pressure chambers 16 accommodating an ink 20 and an actuator plate 1 (corresponds to the piezoelectric actuator of the present invention) joined above the channel unit 11 so as to close the pressure chambers 16.

The channel unit 11 as a whole has a plate-like shape and has a structure in which a manifold plate 13, a channel plate 14, and a pressure chamber plate 15 are laminated in this order on a nozzle plate 12. The plates 12, 13, 14, and 15 are bonded to each other with an epoxy thermosetting adhesive.

The nozzle plate 12 is formed of a polyimide synthetic resin material. A plurality of ink discharge nozzles 19 for ejecting the ink 20 are formed in a row in the nozzle plate 12, as shown in FIG. 1. The manifold plate 13 is formed, for example, of a stainless steel (SUS430), and a plurality of nozzle channels 18 communicated with the ink discharge nozzles 19 are provided in the manifold plate 13. The channel plate 14 is formed of a stainless steel (SUS430), similarly to the manifold plate 13. A plurality of pressure channels 17 communicated with the nozzle channels 18 are provided in the channel plate 14. The pressure chamber plate 15 is also formed of stainless steel (SUS430). A plurality of pressure chambers 16 communicated with the pressure channels 17 are provided in the pressure chamber plate 15. The pressure chambers 16 are connected to the ink tank via a manifold channel and a common ink chamber (not shown in the figure) provided in the channel plate 14 and manifold plate 13. Thus, in the ink-jet head 10, a fluid passage F for the ink 20 is formed from the common ink chamber connected to the ink tank to the ink discharge nozzle 19 via the manifold channel, pressure chamber 16, pressure channel 17, and nozzle channel 18.

The actuator plate 1 laminated on the channel unit 11 includes a vibration plate 2 (corresponds to the substrate of the present invention) constructing part of the wall surface (upper surface in FIG. 1) of the pressure chambers 16, a piezoelectric film 3 formed on the vibration plate 2, and an upper electrode 4 provided on the piezoelectric film 3.

The vibration plate 2 is formed, for example, of stainless steel (SUS430) and has a rectangular shape. The vibration plate 2 is joined by thermocompression to the upper surface of the channel unit 11 so as to cover the entire upper surface of the channel unit 11. The vibration plate 2 is connected to the ground of a drive circuit IC (not shown in the figure) and is used as a lower electrode. In addition, the vibration plate 2 is formed of the metal material (stainless steel (SUS430)) of the same type as the manifold plate 13, channel plate 14, and pressure chamber plate 15 constituting the channel unit 11. As a result, warpage by thermocompression of the vibration plate 2 to the channel unit 11 can be prevented.

The piezoelectric film 3 is formed of a piezoelectric ceramic material such as lead zirconium titanate (PZT) and is laminated with a uniform thickness over the entire surface of the vibration plate 2. The piezoelectric film 3 is formed by the aerosol deposition method and subjected to polarization treatment so as to be polarized in the thickness direction thereof.

A plurality of upper electrodes 4 are provided on the surface of the piezoelectric film 3 on the opposite side from the vibration plate 2. Each of the upper electrodes 4 is provided on the region of the piezoelectric film 3 corresponding to the opening 16A of each of the pressure chambers 16, connected to the drive circuit IC, and used as drive electrode.

When printing is conducted, the predetermined drive signals are generated from the drive circuit IC. Then, the potential of the upper electrodes 4 becomes higher than that of the vibration plate 2 (lower electrode) and an electric field is applied in the polarization direction (thickness direction) of the piezoelectric film 3. Under the effect thereof, the piezoelectric film 3 expands in the thickness direction and shrinks in the surface direction. As a result, the region of the piezoelectric film 3 and vibration plate 2 (that is, the actuator plate 1) which corresponds to the opening of the pressure chamber 16 is locally deformed (unimorph deformation) so as to form a protrusion on the side of the pressure chamber 16 (so as to protrude toward the pressure chamber 16). Therefore, the volume of the pressure chamber 16 decreases, pressure inside the pressure chamber 16 increases, and the ink 20 is ejected from the ink discharge nozzle 19. When the upper electrode 4 then returns to the potential equal to that of the vibration plate 2, the piezoelectric film 3 and vibration plate 2 restore the original shape, and the volume of the pressure chamber 16 returns to the original volume. Therefore, at this time, the ink 20 is sucked in from the ink tank to the pressure chamber 16 via the manifold channel.

A method for manufacturing the actuator plate 1 for the ink-jet head 10 will be described below with reference to FIGS. 2A to 2D.

First, holes which will serve as the nozzle channels 18, pressure channels 17, and pressure chambers 16 are formed by etching respectively in the manifold plate 13, channel plate 14, and pressure chamber plate 15 formed of the stainless steel. Then, the plates are laminated and joined to form a larger section of the channel unit 11 (step of forming an ink channel forming body). Because the nozzle plate 12 is formed of the synthetic resin material, it melts when heated in the below-described annealing treatment. Therefore, the nozzle plate 12 is not joined in this step, but joined after the annealing treatment. However, similarly to other plates 13 to 15, the nozzle plate 12 may be also formed of the stainless steel. In this case, the holes which will serve as the ink discharge nozzles 19 may be formed by press forming in the nozzle plate 12 in the step of forming the ink channel forming body, and this nozzle plate 12 may be joined after lamination together with other plates 13 to 15 to form the entire channel unit 11.

Then, as shown in FIG. 2A, the vibration plate 2 formed of the stainless steel is aligned and placed on the upper surface of the pressure chamber plate 15 in the channel unit 11 and joined by thermocompression to seal the openings 16A of pressure chambers 16 with the vibration plate 2 (step of joining the vibration plate).

Figure 2B:
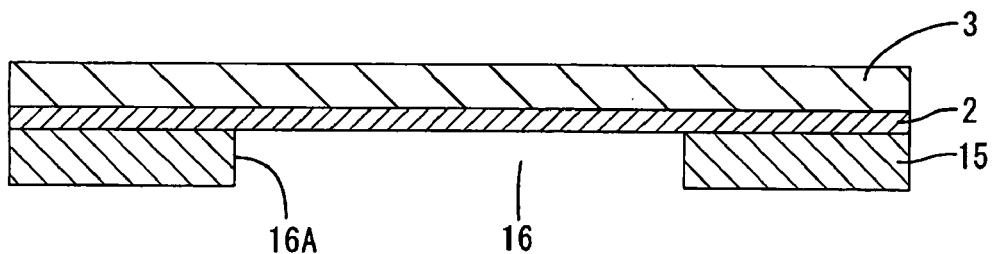
Figure 2C:
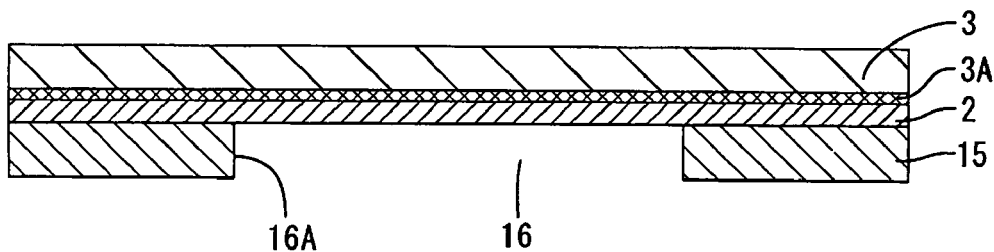
Figure 3:
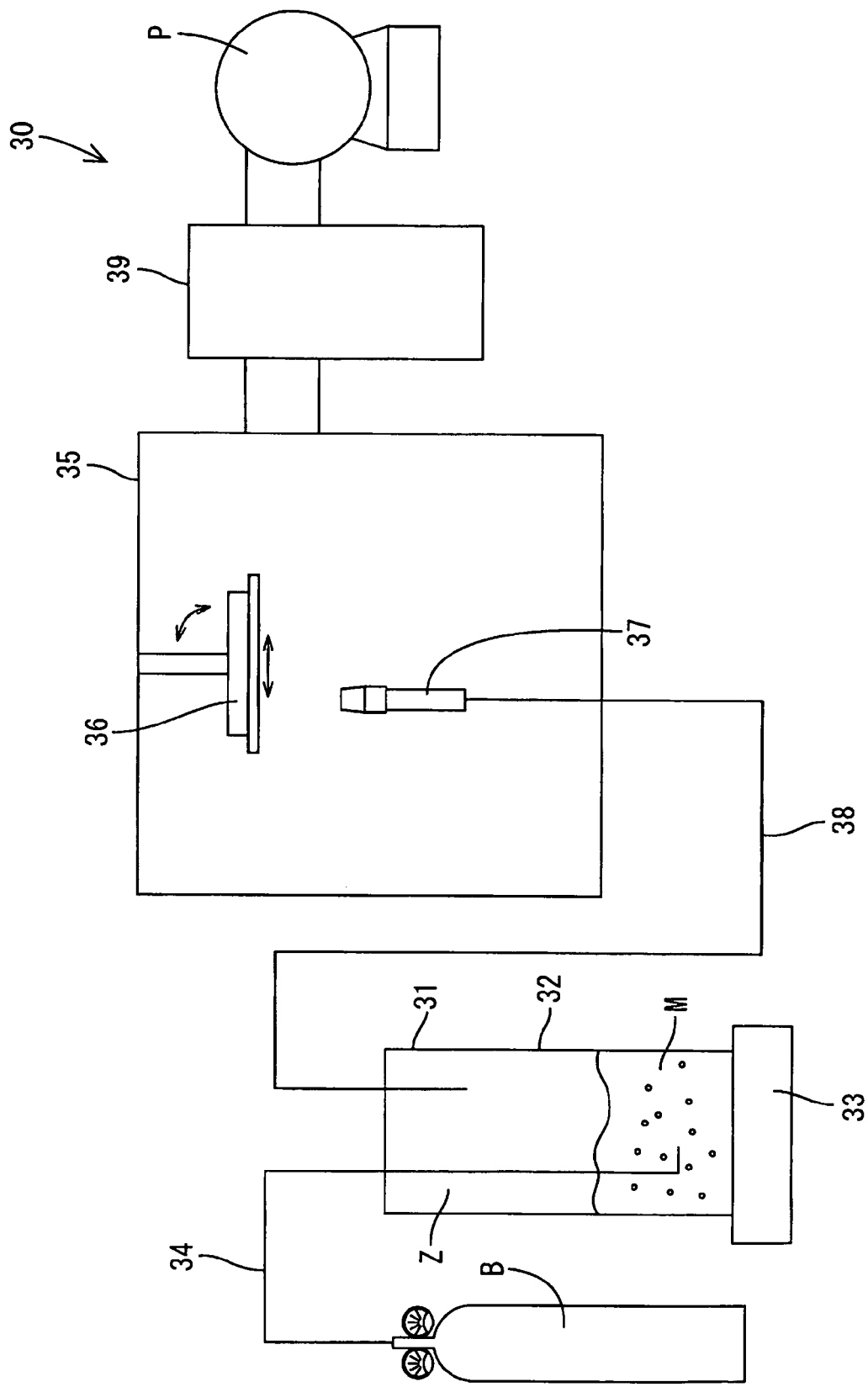
Figure 4:
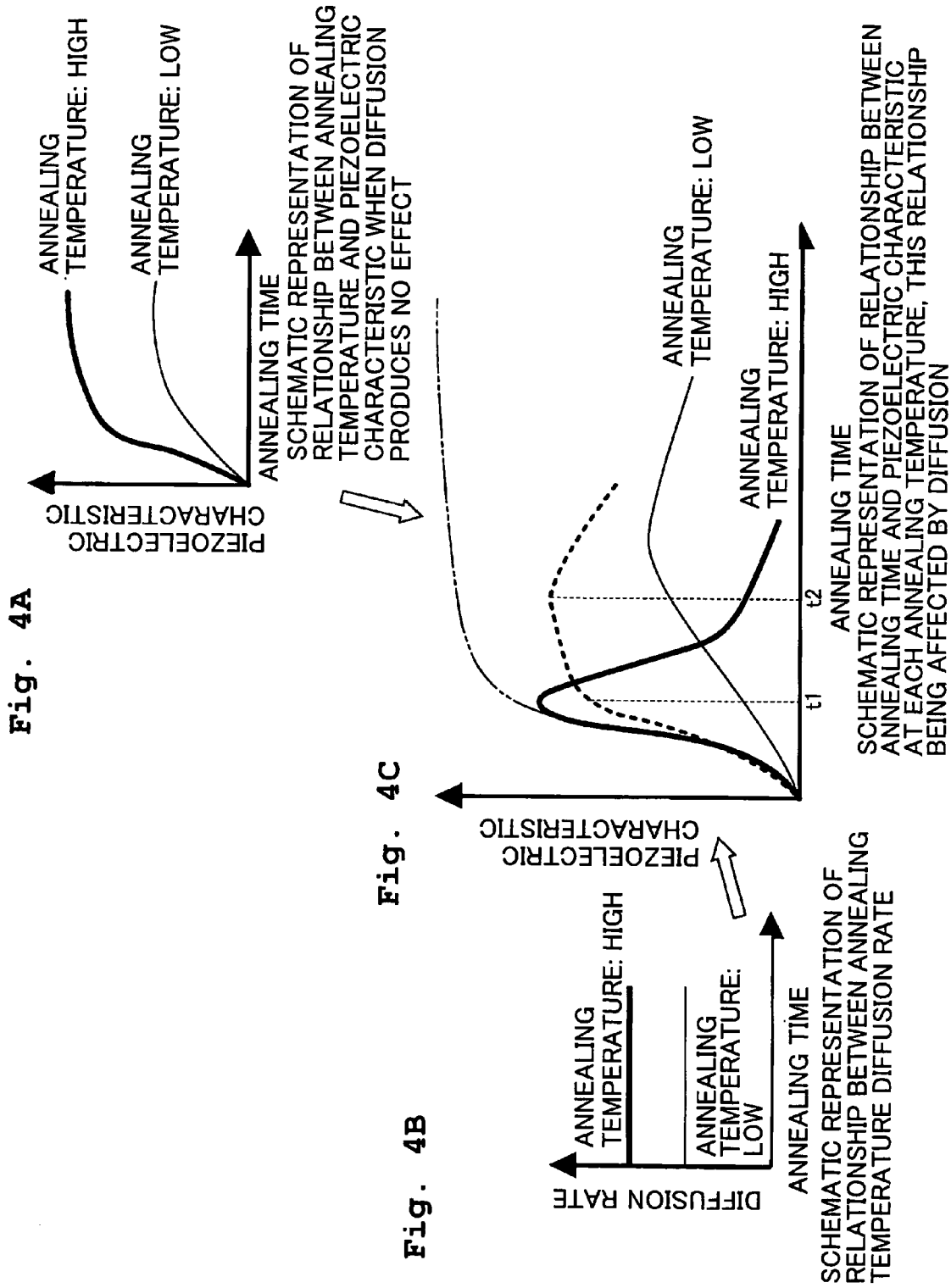

Then, as shown in FIG. 2B, the piezoelectric film 3 is formed by the aerosol deposition method (AD method) on the vibration plate 2 (step of forming the piezoelectric film). FIG. 3 shows schematically a film forming device 30 for forming the piezoelectric film 3. This film forming device 30 includes an aerosol generator 31 for forming aerosol z by dispersing material particles M in a carrier gas, and a film forming chamber 35 for ejecting the aerosol Z from the ejection nozzle 37 and depositing on a substrate.

The aerosol generator 31 has an aerosol chamber 32 capable of accommodating the material particles M inside thereof and an oscillation unit 33 attached to the aerosol chamber 32 for causing oscillations of the aerosol chamber 32. A gas cylinder B for introducing the carrier gas is connected to the aerosol chamber 32 via the introduction pipe 34. An end of the introduction pipe 34 is positioned close to the bottom surface inside the aerosol chamber 32 and disposed so as to be buried in the material particles M. An inactive gas such as helium, argon and nitrogen, air and oxygen can be used as the carrier gas.

The film forming chamber 35 has a stage 36 for mounting the substrate where the piezoelectric layer will be formed and the ejection nozzle 37 provided below the stage 36. The ejection nozzle 37 is connected to the aerosol chamber 32 via an aerosol supply pipe 38 so as to supply the aerosol Z in the aerosol chamber 32 to the ejection nozzle 37 via the aerosol supply pipe 38. Furthermore, a vacuum pump P is connected via a powder recovery unit 39 to the film forming chamber 35, so as to decrease pressure of the inside thereof.

When the piezoelectric film 3 is formed by using the film forming device 30 of the above-described structure, first, the vibration plate 2 is set in the stage 36. Then, the material particles M are charged into the aerosol chamber 32. For example, lead zirconium titanate (PZT) is used as the material particles M.

A carrier gas is then introduced from the gas cylinder B into the aerosol chamber 32 and the material particles M are raised upward by the gas pressure. At the same time, the aerosol chamber 32 is oscillated with the oscillation unit 33, thereby mixing the material particles M with the carrier gas and generating aerosol Z. The pressure inside the film forming chamber 35 is then reduced with the vacuum pump P to generate the difference in pressure between he aerosol chamber 32 and film forming chamber 35, and the aerosol Z in the aerosol chamber 32 is ejected from the ejection nozzle 37, while being accelerated to a high speed, by this difference in pressure. The material particles M contained in the ejected aerosol Z collide with the vibration plate 2 and are deposited on the vibration plate 2, thereby forming the piezoelectric film 3.

Then, the formed piezoelectric film 3 is subjected to annealing treatment (a step of annealing) to obtain the necessary piezoelectric characteristic. In this annealing step, initially, the first annealing step is implemented at a high temperature and within a short time. Thus, the vibration plate 2 with the piezoelectric film 3 formed thereon is loaded into an electric furnace heated, for example, to about 800° C. and heating treatment is conducted for about 2 min.

Then, after the first annealing step, the piezoelectric film 3 is subjected to the second annealing step. In the second annealing step, annealing is conduced at a temperature lower and for a time longer than those of the first annealing step. Thus, after the first annealing step, the vibration plate 2 is transferred into another electric furnace heated, for example, to about 500 to 700° C. and then heated for 10 to 30 min.

Here, the relationships between the annealing temperature, annealing time during annealing and piezoelectric characteristic will be explained qualitatively with reference to FIGS. 4A to 4C.

FIG. 4A is a graph illustrating the relationship between the annealing time and piezoelectric characteristic in the case where the piezoelectric film 3 is not affected by diffusion during annealing. When the annealing treatment is conducted at a high temperature (thick solid line in FIG. 4A), grain growth rapidly proceeds, until a predetermined period of time is elapsed after the annealing was started and the level of piezoelectric characteristic greatly increases, as shown in FIG. 4A. However, once a certain piezoelectric characteristic has been obtained, then the level of piezoelectric characteristic with respect to the annealing time raises gradually. At this time, the lattice defects are corrected. On the other hand, when the annealing treatment is conducted at a low temperature, as shown by a thin solid line in FIG. 4A, the level of piezoelectric characteristic greatly increases until a predetermined period of time is elapsed after the annealing was started and then rises gradually, similarly to the case where the annealing was conducted at a high temperature (thick solid line in FIG. 4A). However, because the initial grain growth is insufficient, the obtained piezoelectric characteristic is inferior to that obtained with the high-temperature annealing.

FIG. 4B is a graph illustrating the relationship between the diffusion rate of metal elements from the substrate to the piezoelectric film and the annealing time. The diffusion rate of metal elements into the piezoelectric film 3, as shown in FIG. 4B, is constant against the annealing time, but increases with the increase in annealing temperature.

FIG. 4C is a graph illustrating the relationship between the annealing time and piezoelectric characteristic in the case where the piezoelectric film 3 is affected by diffusion during annealing. The relationships shown in FIG. 4A and FIG. 4B demonstrate that when the annealing temperature is high, the level of piezoelectric characteristic rises rapidly owing to grain growth at the initial stage of annealing (annealing time: 0 to $t_1$), as shown by a thick solid line in FIG. 4C. However, when the annealing is further continued (annealing time: after $t_1$), the piezoelectric characteristic degrades significantly with the annealing time. This is because diffusion greatly advances as the time elapses since the heating is conducted at a high temperature.

On the other hand, when the annealing temperature is low, as shown by a thin solid line in FIG. 4C, although the effect of initial improvement of piezoelectric characteristic caused by grain growth is small, the degradation of piezoelectric characteristic is also small even if heating is conducted for a long time. This is because the diffusion effect is small despite a long duration of heating since the heating is conducted at a low temperature. The aforementioned relationship between the annealing temperature and piezoelectric characteristic will be explained below in greater detail (explanation of FIG. 5).

By contrast, when the first annealing step in which annealing is conducted for a short time at a high temperature is combined with the second annealing step in which annealing is conducted for a long time at a low temperature, as in the present embodiment, a piezoelectric characteristic represented by a thick dot line in FIG. 4C is obtained. In this case, initially, in the first annealing step (annealing time: 0 to $t_1$ in FIG. 4C), grain growth is promoted by heating at a high temperature and the level of piezoelectric characteristic rises dramatically. In this case, a diffusion layer 3A is formed by diffusion of metal elements such as Fe and Cr contained in the vibration plate 2 into the piezoelectric film 3 due to heating (see also FIG. 2C), but because the heating time is very short, the growth of the diffusion layer 3A is quite small and therefore, the piezoelectric characteristic is not practically affected.

Then, in the second annealing step (annealing time: $t_1$ to $t_2$ in FIG. 4C), heating is conducted for a long time at a low temperature. Therefore, lattice defects of the piezoelectric film 3 that appeared during film formation are corrected. At this time, because the annealing temperature is low, the growth of the diffusion layer 3A is extremely slow and therefore, the piezoelectric characteristic is not practically affected. However, as shown by a thick dot line in FIG. 4C, in the second annealing step, when heating is conducted for a very long time, the piezoelectric characteristic is decreased by the advance of diffusion. For this reason, it is preferred that the annealing treatment be ended before the effect of diffusion becomes dominant (before annealing time $t_2$ in FIG. 4C).

When the first annealing step in which annealing is conducted for a short time at a high temperature is combined with the second annealing step in which annealing is conducted for a long time at a low temperature, as described above, sufficient piezoelectric characteristic can be obtained within a range where the growth of the diffusion layer 3A does not advance significantly.

Furthermore, in the above-described embodiment, the vibration plate 2 was placed into an electric furnace previously heated to the predetermined temperature, but the temperature rising may be started after the vibration plate 2 has been placed into the electric furnace. However, in this case, because the grain growth is not promoted sufficiently till the inside of the furnace is heated to the sufficient temperature after the annealing has been started, it is preferred that the temperature rising rate of the electric furnace be high (for example, not less than 800° C./min). However, when the furnace is previously heated to the predetermined temperature, as in the present embodiment, the grain growth actively arises immediately after the vibration plate 2 is placed into the furnace. Therefore, a high piezoelectric characteristic can be obtained.

Figure 2D:
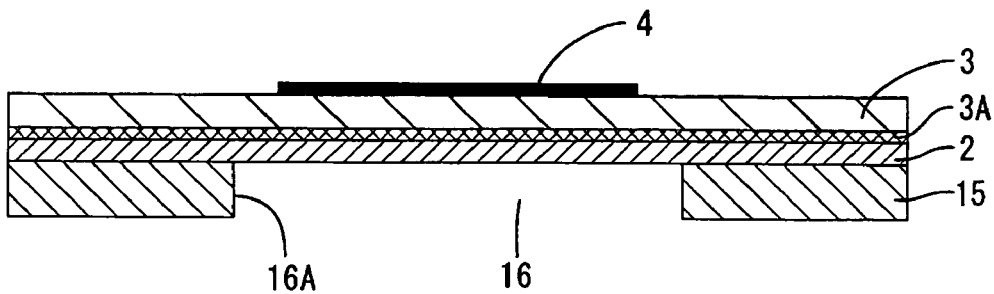

Then, as shown in FIG. 2D, the upper electrodes 4 and a plurality of lead sections (not shown in the figure) connected to upper electrodes 4 are formed on the upper surface of the piezoelectric film 3. In order to form the upper electrodes 4 and lead sections, for example, a conductive film may be formed on the entire area of the piezoelectric film 3 and then the predetermined pattern may be formed by using a photolithography—etching method. Alternatively, a pattern may be directly formed on the upper surface of the piezoelectric film 3 by a screen printing method. In this process, as shown in FIG. 2D, the upper electrodes 4 are formed in the regions of the piezoelectric film 3 which correspond to the openings of the pressure chamber plate 15.

An electric field with an intensity higher than that during the usual ink ejection operation is then applied between the upper electrodes 4 and vibration plate 2 to polarize the piezoelectric film 3 in the thickness direction (polarization treatment). Finally, the nozzle plate 12 is joined to the manifold plate 13. The ink-jet head 10 is produced by the above-mentioned process.

As described above, in the present embodiment, the annealing treatment of the piezoelectric film (piezoelectric actuator) is conducted in two steps: the first annealing step and the second annealing step conducted at a temperature lower and for a time longer than those of the first annealing step. As a result, the grain growth can be sufficiently proceeded, while minimizing the growth of the diffusion layer 3A, by the first annealing step conducted for a short time at a high temperature, and then the lattice defects in the particles can be sufficiently corrected, while preventing the diffusion, by the second annealing step conducted for a long time at a low temperature. As a result, the piezoelectric characteristic can be improved by sufficiently conducting the annealing treatment, while restricting the thickness of the diffusion layer 3A to a range where the piezoelectric characteristic is not affected. Furthermore, in the present embodiment, the vibration plate 2 is disposed inside the electric furnace and the annealing treatment is conducted, after the temperature inside the electric furnace has been raised to the annealing temperature. As a result, the piezoelectric film 3 can be annealed at a high temperature enabling grain growth for as long a time as possible within a range in which the diffusion layer can be prevented to a minimum. Therefore, the piezoelectric characteristic can be sufficiently improved.

The present invention will be explained below in greater detail with reference to examples thereof.

Preparatory tests in order to examine the effect of annealing temperature and time on piezoelectric characteristic <Preparatory Test 1>

1. Formation of Piezoelectric Layer

1) Film Formation

A stainless steel (SUS430) plate was used as the substrate, and PZT with a mean particle size of about 0.7 μm (0.3-1 μm) was used as the material particles. A device identical to that of the above-described embodiment was used as the film forming device. The piezoelectric film was formed by blowing aerosol on the substrate surface. The piezoelectric film was formed under the following conditions: nozzle opening 0.4 mm×10 mm, pressure inside the film forming chamber 200 Pa, pressure inside the aerosol chamber 30,000 Pa, He carrier gas, gas flow rate 4.5 L/min, and spacing between the nozzle and substrate 10-20 mm. As a result, the thickness of the piezoelectric film was about 9 μm. The thickness of the piezoelectric film was measured by differential (difference in thickness) measurements with a surface roughness meter.

2) Annealing Treatment

Then, the formed piezoelectric film was subjected to the annealing treatment. More specifically, the substrate with the piezoelectric layer formed thereon was placed into a muffler furnace (FP100, manufactured by Yamato Kogyo Co.) with the temperature raised to 900° C. which is an upper limit temperature of the muffler furnace. The substrate was held for 60 sec at 900° C. inside the furnace, then removed from the furnace and cooled to room temperature by natural cooling.

2. Test

Masking was conducted on the piezoelectric film by using an adhesive resin tape, upper electrodes with an effective surface area of 3.6 mm² or more was formed by using an Au deposition apparatus, and the stainless steel plate (substrate) was used as a lower electrode. In this way, a piezoelectric actuator was constructed. Then, the polarization treatment of the piezoelectric film was conducted. Electrostatic capacity of the piezoelectric actuator manufactured by the above-described method was measured, while applying a voltage, by using a ferroelectric meter (TFANALYZER 2000; manufactured by AiXACT Co.), and the residual polarization (Pr) and coercive electric field (Ec) were measured.

<Preparatory Test 2>

The piezoelectric film was formed and tested in the same manner as in Preparatory Test 1, except that the thickness of the piezoelectric film was 8 μm, annealing temperature was 900° C., annealing time was 30 sec.

<Preparatory Test 3>

The piezoelectric film was formed and tested in the same manner as in Preparatory Test 1, except that the thickness of the piezoelectric film was 9 μm, annealing temperature was 900° C., annealing time was 60 sec.

<Preparatory Test 4>

The piezoelectric film was formed and tested in the same manner as in Preparatory Test 1, except that the thickness of the piezoelectric film was 8 μm, annealing temperature was 900° C., annealing time was 80 sec.

<Preparatory Test 5>

The piezoelectric film was formed and tested in the same manner as in Preparatory Test 1, except that the thickness of the piezoelectric film was 6 μm, annealing temperature was 900° C., annealing time was 120 sec.

<Preparatory Test 6>

The piezoelectric film was formed and tested in the same manner as in Preparatory Test 1, except that the thickness of the piezoelectric film was 9 μm, annealing temperature was 850° C., annealing time was 30 sec.

<Preparatory Test 7>

The piezoelectric film was formed and tested in the same manner as in Preparatory Test 1, except that the thickness of the piezoelectric film was 7 μm, annealing temperature was 850° C., annealing time was 30 sec.

<Preparatory Test 8>

The piezoelectric film was formed and tested in the same manner as in Preparatory Test 1, except that the thickness of the piezoelectric film was 12 μm, annealing temperature was 850° C., annealing time was 60 sec.

<Preparatory Test 9>

The piezoelectric film was formed and tested in the same manner as in Preparatory Test 1, except that the thickness of the piezoelectric film was 7 μm, annealing temperature was 850° C., annealing time was 60 sec.

<Preparatory Test 10>

The piezoelectric film was formed and tested in the same manner as in Preparatory Test 1, except that the thickness of the piezoelectric film was 12 μm, annealing temperature was 850° C., annealing time was 120 sec.

<Preparatory Test 11>

The piezoelectric film was formed and tested in the same manner as in Preparatory Test 1, except that the thickness of the piezoelectric film was 10 μm, annealing temperature was 850° C., annealing time was 180 sec.

<Preparatory Test 12>

The piezoelectric film was formed and tested in the same manner as in Preparatory Test 1, except that the thickness of the piezoelectric film was 5 μm, annealing temperature was 850° C., annealing time was 180 sec.

<Preparatory Test 13>

The piezoelectric film was formed and tested in the same manner as in Preparatory Test 1, except that the thickness of the piezoelectric film was 8 μm, annealing temperature was 800° C., annealing time was 30 sec.

<Preparatory Test 14>

The piezoelectric film was formed and tested in the same manner as in Preparatory Test 1, except that the thickness of the piezoelectric film was 9 μm, annealing temperature was 800° C., annealing time was 60 sec.

<Preparatory Test 15>

The piezoelectric film was formed and tested in the same manner as in Preparatory Test 1, except that the thickness of the piezoelectric film was 6 μm, annealing temperature was 800° C., annealing time was 60 sec.

<Preparatory Test 16>

The piezoelectric film was formed and tested in the same manner as in Preparatory Test 1, except that the thickness of the piezoelectric film was 13 μm, annealing temperature was 800° C., annealing time was 300 sec.

<Preparatory Test 17>

The piezoelectric film was formed and tested in the same manner as in Preparatory Test 1, except that the thickness of the piezoelectric film was 6.5 μm, annealing temperature was 800° C., annealing time was 260 sec.

<Preparatory Test 18>

The piezoelectric film was formed and tested in the same manner as in Preparatory Test 1, except that the thickness of the piezoelectric film was 16 μm, annealing temperature was 800° C., annealing time was 1260 sec.

<Preparatory Test 19>

The piezoelectric film was formed and tested in the same manner as in Preparatory Test 1, except that the thickness of the piezoelectric film was 16 μm, annealing temperature was 750° C., annealing time was 180 sec.

<Preparatory Test 20>

The piezoelectric film was formed and tested in the same manner as in Preparatory Test 1, except that the thickness of the piezoelectric film was 12.5 μm, annealing temperature was 750° C., annealing time was 300 sec.

<Preparatory Test 21>

The piezoelectric film was formed and tested in the same manner as in Preparatory Test 1, except that the thickness of the piezoelectric film was 5 μm, annealing temperature was 750° C., annealing time was 180 sec.

<Preparatory Test 22>

The piezoelectric film was formed and tested in the same manner as in Preparatory Test 1, except that the thickness of the piezoelectric film was 7.5 μm, annealing temperature was 700° C., annealing time was 30 sec.

<Preparatory Test 23>

The piezoelectric film was formed and tested in the same manner as in Preparatory Test 1, except that the thickness of the piezoelectric film was 12.5 μm, annealing temperature was 700° C., annealing time was 300 sec.

<Preparatory Test 24>

The piezoelectric film was formed and tested in the same manner as in Preparatory Test 1, except that the thickness of the piezoelectric film was 6 μm, annealing temperature was 700° C., annealing time was 300 sec.

<Preparatory Test 25>

The piezoelectric film was formed and tested in the same manner as in Preparatory Test 1, except that the thickness of the piezoelectric film was 6 μm, annealing temperature was 700° C., annealing time was 480 sec.

<Results and Discussions>

The annealing temperature, the annealing time, the thickness of the piezoelectric film, the annealing time per unit thickness of the piezoelectric film, the electric field applied in the polarization treatment, the residual polarization Pr, coercive electric field Ec, and Pr/Ec obtained in Preparatory Tests 1 to 25 are shown in Table 1.

tric film was larger, Pr/Ec was lower than that in Preparatory Test 9, despite the fact that the annealing conditions were identical. However, when the annealing time was 120 sec (the case of extended annealing time), as in Preparatory Test 10 in which the thickness of the piezoelectric film was the same as that in Preparatory Test 8, a good piezoelectric characteristic was obtained. This result demonstrated that when the thickness of the piezoelectric film is large, it is preferred that the annealing time be somewhat extended.

Figure 5:
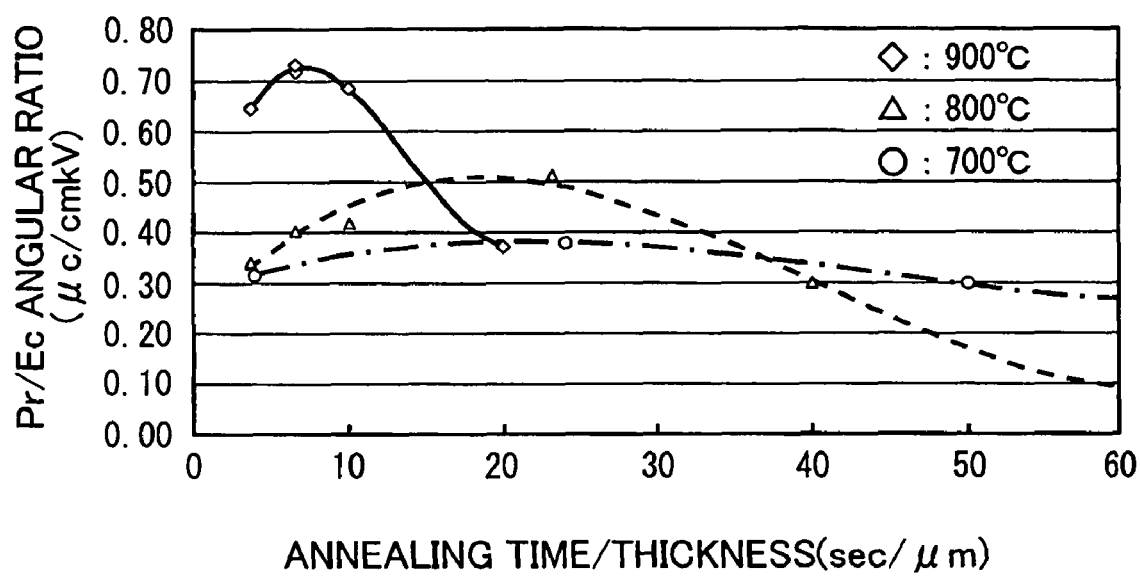
FIG. 5 is a graph illustrating the relationship between the annealing time and piezoelectric characteristic.
Figure 6:
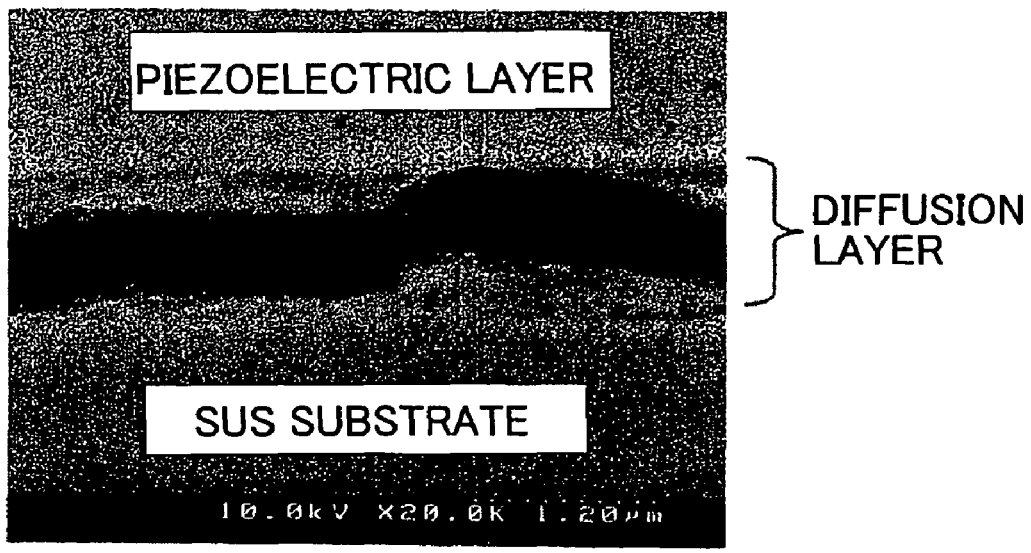
FIG. 6 is a SEM image illustrating the formation of the diffusion layer on the interface between the substrate and the piezoelectric film by the annealing treatment.
Figure 7:
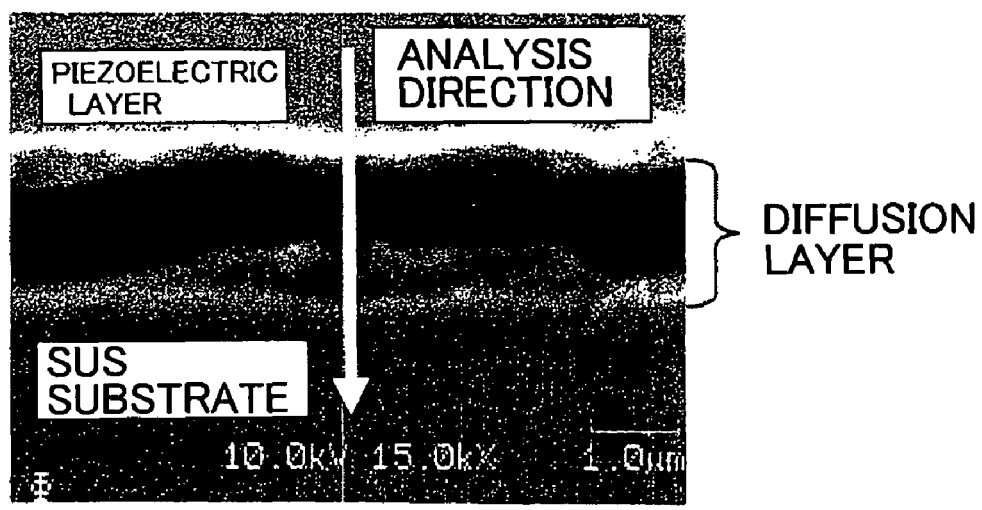
FIG. 7 shows AES analysis results illustrating the formation of the diffusion layer on the interface between the substrate and the piezoelectric film by the annealing treatment.
Figure 8:
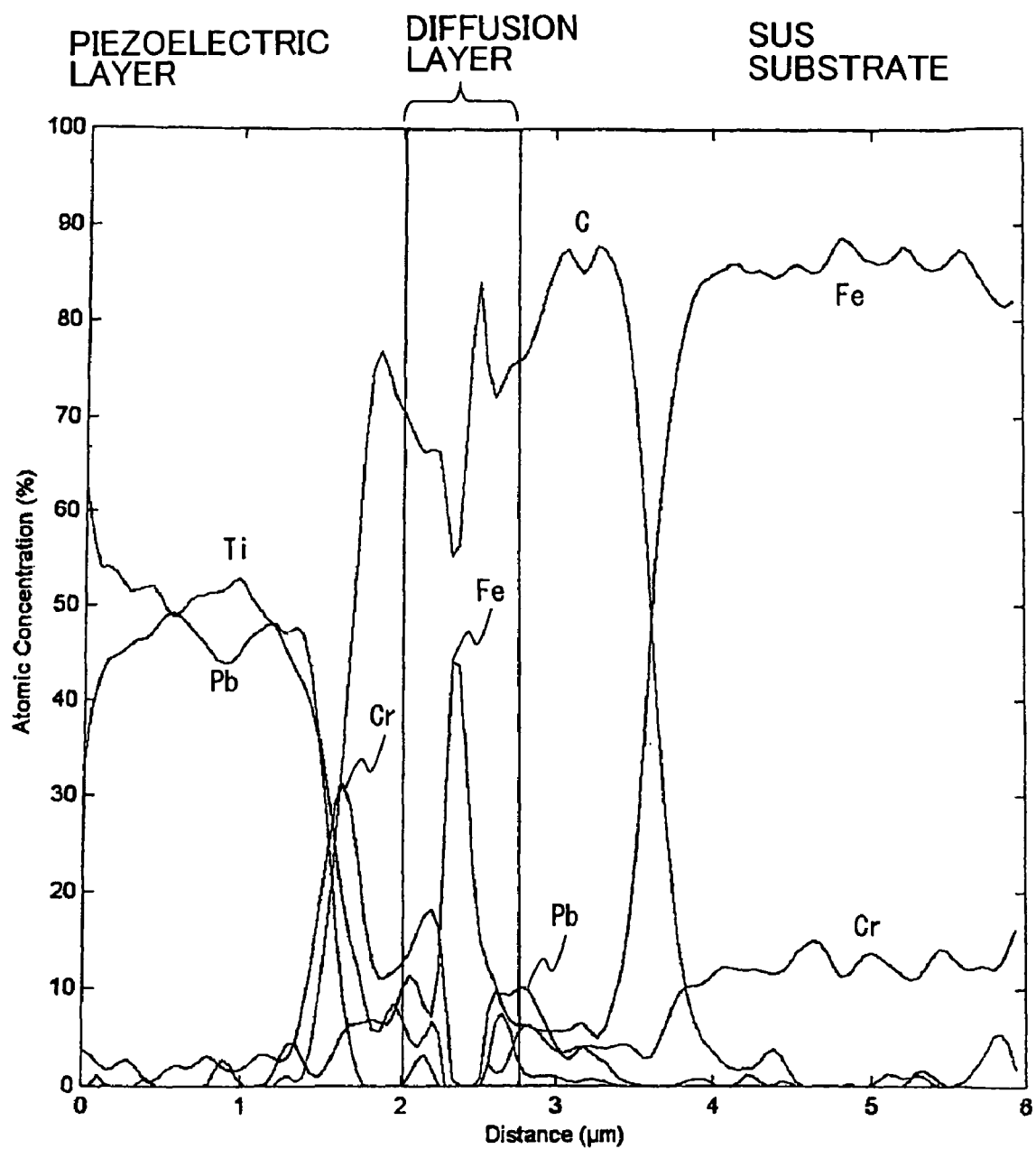
FIG. 8 illustrates the atomic concentration distribution of elements in the direction shown by an arrow in FIG. 7.

The relationships between the annealing time and piezoelectric characteristic at annealing temperatures of 700° C., 800° C., and 900° C. were obtained based on the results of the above-described preparatory test. Those relationships are shown in FIG. 5. In FIG. 5, the ratio of annealing time to the piezoelectric film thickness (sec/μm) is plotted on the

TABLE 1

| Preparatory test No. | Annealing temp., ° C. | Annealing time, sec | Piezoelec. film thickness, μm | Annealing time/thickness sec/μm | Applied electric field, V/cm | Pr μC/cm | Ec V/cm | Pr/Ec μCcm/Kv |
|---|---|---|---|---|---|---|---|---|
| 1 | 900 | 60 | 9 | 6.7 | 222 | 36 | 49 | 0.73 |
| 2 | 900 | 30 | 8 | 3.8 | 240 | 41 | 64 | 0.64 |
| 3 | 900 | 60 | 9 | 6.7 | 270 | 54 | 75 | 0.72 |
| 4 | 900 | 80 | 8 | 10.0 | 170 | 49 | 72 | 0.68 |
| 5 | 900 | 120 | 6 | 20.0 | 175 | 67 | 176 | 0.37 |
| 6 | 850 | 30 | 9 | 3 | 278 | 30 | 68 | 0.44 |
| 7 | 850 | 30 | 7 | 4 | 357 | 32 | 78 | 0.41 |
| 8 | 850 | 60 | 12 | 5 | 300 | 30 | 67 | 0.45 |
| 9 | 850 | 60 | 7 | 9 | 300 | 37 | 62 | 0.60 |
| 10 | 850 | 120 | 12 | 10 | 283 | 35 | 62 | 0.56 |
| 11 | 850 | 180 | 10 | 18 | 200 | 32 | 54 | 0.59 |
| 12 | 850 | 180 | 5 | 36 | 400 | 37 | 68 | 0.55 |
| 13 | 800 | 30 | 8 | 3.8 | 300 | 28 | 83 | 0.34 |
| 14 | 800 | 60 | 9 | 6.7 | 244 | 26 | 63 | 0.41 |
| 15 | 800 | 60 | 6 | 10.0 | 225 | 53 | 115 | 0.42 |
| 16 | 800 | 300 | 13 | 23.1 | 231 | 31 | 60 | 0.51 |
| 17 | 800 | 260 | 6.5 | 40.0 | 277 | 26 | 90 | 0.30 |
| 18 | 800 | 1260 | 16 | 78.8 | 141 | 22 | 75 | 0.30 |
| 19 | 750 | 180 | 16 | 11 | 200 | 32 | 47 | 0.69 |
| 20 | 750 | 300 | 12.5 | 24 | 260 | 33 | 62 | 0.53 |
| 21 | 750 | 180 | 5 | 36 | 400 | 33 | 74 | 0.45 |
| 22 | 700 | 30 | 7.5 | 4.0 | 320 | 23 | 73 | 0.32 |
| 23 | 700 | 300 | 12.5 | 24.0 | 288 | 24 | 64 | 0.38 |
| 24 | 700 | 300 | 6 | 50.0 | 240 | 22 | 74 | 0.30 |
| 25 | 700 | 480 | 6 | 80.0 | 292 | 32 | 115 | 0.28 |

Comparison of Pr/Ec obtained with the annealing time of 60 sec and Pr/Ec obtained with the annealing time of 30 sec in the preparatory tests conducted at the annealing temperature of 900° C., 850° C., and 800° C., which are shown in Table 1, clearly demonstrated that Pr/Ec in the case of annealing time of 60 sec became higher than that in the case of annealing time of 30 sec. This result demonstrated that in order to give sufficient grain growth at the initial stage of annealing and to obtain a high piezoelectric characteristic, the time of heating at a high temperature is preferably at least 1 min. The parameter Pr/Ec (rectangularity ratio) is a parameter demonstrating whether the piezoelectric characteristic is good or poor; when this parameter has a large value, the piezoelectric film can be deformed to a greater extent under a smaller applied field.

Furthermore, as appreciated from Table 1, when the annealing treatment was conducted for 60 sec at the annealing temperature of 900° C. (Preparatory Test 1), Pr/Ec had a good value of 0.73, and when the annealing treatment was conducted for 60 sec at the annealing temperature of 850° C. (Preparatory Test 9), Pr/Ec had a good value of 0.60. Therefore, it possible to obtain a good piezoelectric characteristic by conducting annealing for not less than 60 sec at a comparatively high temperature.

Comparison of Preparatory Tests 8 and 9 demonstrated that in Preparatory Test 8 in which the thickness of the piezoelecabscissa axis, and Pr/Ec (rectangularity ratio) is plotted on the ordinate axis. As shown in FIG. 5, when the annealing temperature was 900° C., the level of piezoelectric characteristic increased at a high rate due to grain growth at the initial stage of annealing, but when the annealing was continued, the piezoelectric characteristic degraded significantly with the annealing time. This is because diffusion greatly advances as time elapses since the heating is conducted at a high temperature. On the other hand, in the case of a comparatively low annealing temperature of 800° C. or 700° C., the effect of initial increase in piezoelectric characteristic due to grain growth is less than that observed when the annealing temperature is 900° C., but the degradation of piezoelectric characteristic is also small, despite a long-time heating. This is because the effect of diffusion is small despite a long-time heating since the heating is conducted at a low temperature.

EXAMPLES OF THE FIRST ANNEALING STEP AND SECOND ANNEALING STEP

Example 1

In Example 1, a piezoelectric film (PZT) with a thickness of 7 μm was formed on a substrate (SUS430) in the same manner as in the above-described preparatory tests. Then, the substrate with the piezoelectric film formed thereon was introduced into a muffler furnace with a temperature raised to 850° C. and held for 1 min (this process is the first annealing step).

Then, the substrate was transferred to another muffler furnace with a temperature raised to 700° C. and held therein for 3 min. The substrate was thereafter transferred to another muffler furnace with a temperature raised to 600° C., held therein for 5 min, then transferred to another muffler furnace with a temperature raised to 500° C., and held therein for 15 min (this process is the second annealing step). The substrate was then removed from the furnace and cooled to room temperature by natural cooling. A piezoelectric actuator was then constructed in the same manner as in the preparatory tests.

The piezoelectric actuator fabricated in this example was tested in the same manner as in the preparatory tests. The applied electric field in the polarization treatment was 150 kV/cm.

As a result, the coercive electric field Ec was 35 kV/cm, the residual polarization Pr was 25 $\mu C/cm^2$, and Pr/Ec was 0.73. The piezoelectric characteristic thus obtained was better than that obtained when annealing was conducted in one stage for an annealing time of 1 to 3 min at an annealing temperature of 850° C. (Preparatory Tests 9 to 12).

Example 2

In Example 2, a piezoelectric film (PZT) with a thickness of 9 μm was formed on a substrate (SUS430) in the same manner as in the preparatory tests.

Then, the piezoelectric film surface was irradiated for 2 min by using an infrared lamp (manufactured by Inkridge Co., HSH-1). In this process, the irradiation intensity was adjusted so that the surface temperature of the piezoelectric film becomes about 1000° C. (this process is the first annealing step).

Then, the piezoelectric film was irradiated was for 5 min after the irradiation intensity was adjusted so that the piezoelectric film surface has a temperature of about 600° C. Then, the piezoelectric film was irradiated for 10 min after the irradiation intensity was adjusted so that the piezoelectric film surface has a temperature of about 500° C. (this process is the second annealing step). The piezoelectric film was then cooled to room temperature by natural cooling. The piezoelectric actuator was then constructed in the same manner as in Example 1.

The piezoelectric actuator fabricated in this example was tested in the same manner as in the preparatory tests. The applied electric field in the polarization treatment was 150 kV/cm.

As a result, the coercive electric field Ec was 25 kV/cm, the residual polarization Pr was 25 $\mu C/cm^2$, and Pr/Ec was 1.00. A good piezoelectric characteristic was thus obtained.

Example in Which Composition of Material Particles Was Changed

Example 3

In example 3, PZT added with Nb was used as a material for forming the piezoelectric film. In Example 3, first, a piezoelectric film with a thickness of 7 μm was formed on a substrate (SUS430) in the same manner as in the preparatory tests. Then, this piezoelectric film was subjected to annealing under the same conditions as in Example 1. Then, a piezoelectric actuator was constructed in the same manner as in Example 1.

The piezoelectric actuator fabricated in this example was tested in the same manner as in the preparatory tests. The applied electric field in the polarization treatment was 150 kV/cm.

As a result, the coercive electric field Ec was 35 kV/cm, the residual polarization Pr was 24 $\mu C/cm^2$, and Pr/Ec was 0.69. A good piezoelectric characteristic was thus obtained.

Comparative Example

In a comparative example, a piezoelectric film with a thickness of 10 μm was formed in the same manner as in the preparatory tests by using material particles identical to those of Example 3. The substrate with the piezoelectric film formed thereon was then introduced into a muffler furnace with a temperature raised to 850° C. and annealing was conducted by holding for 3 min. Then, the substrate was removed from the furnace and cooled to room temperature by natural cooling. The piezoelectric actuator was then constructed in the same manner as in Example 1. The piezoelectric actuator fabricated in the comparative example was tested in the same manner as in the preparatory tests. The applied electric field in the polarization treatment was 250 kV/cm.

As a result, the coercive electric field Ec was 67 kV/cm, the residual polarization Pr was 35 $\mu C/cm^2$, and Pr/Ec was 0.52. The comparison of Example 3 and the comparative example demonstrated that even when the composition of the material particles was changed, good piezoelectric could be obtained in the same manner as Example 1 by conducting annealing in a stepwise manner.

The technological scope of the present invention is not limited to the above-described embodiment. For example, the following configurations are also included into the technological scope of the present invention. Furthermore, the technological scope of the present invention also encompasses the range of equivalents. (1) In the above-described embodiment, the vibration plate 2 was formed of stainless steel (SUS430). However, the substrate material is not limited to the stainless steel (SUS430) as long as a material is generally used for piezoelectric actuators. Thus, for example, SUS304 and 42A alloy may be used. (2) In the above-described embodiment, the vibration plate 2 was disposed in an electric furnace previously heated to the predetermined temperature, but heating may be also started after disposing the vibration plate 2 in the electric furnace. In this case, it is preferred that the treatment atmosphere be heated to the predetermined annealing temperature as fast as possible.

The invention claimed is:

1. A method for manufacturing a piezoelectric actuator provided with a substrate and a piezoelectric film formed on the substrate, the method comprising the steps of:

forming the piezoelectric film by blowing an aerosol containing particles of a piezoelectric material on a surface of the substrate to adhere the particles to the substrate; and annealing the piezoelectric film, wherein the step of annealing includes a first annealing step and a second annealing step conducted after the first annealing step and having an annealing temperature lower and an annealing time longer than those of the first annealing step, wherein the piezoelectric film is substantially formed before the step of annealing, and wherein a treatment atmosphere in which the substrate is disposed for conducting the first annealing step is not required to be different from a treatment atmosphere in which the substrate is disposed for conducting the second annealing step.

2. The method for manufacturing the piezoelectric actuator according to claim 1, wherein, in the first annealing step, the annealing temperature is not less than 700° C. and the annealing time is not less than 1 minute to not more than 3 minutes.

3. The method for manufacturing the piezoelectric actuator according to claim 1, wherein, in the second annealing step, the annealing temperature is not less than 500° C. to not more than 650° C. and the annealing time is not less than 10 minutes to not more than 30 minutes.

4. The method for manufacturing the piezoelectric actuator according to claim 1, wherein, in the first annealing step, a temperature is raised to the annealing temperature at a temperature rise rate of not less than 800° C./min.

5. The method for manufacturing the piezoelectric actuator according to claim 1, wherein, in the first annealing step, a temperature of the treatment atmosphere is previously raised to the annealing temperature and then the substrate is disposed in the treatment atmosphere to conduct annealing.

6. The method for manufacturing the piezoelectric actuator according to claim 1, wherein the substrate is a metallic substrate.

7. The method for manufacturing the piezoelectric actuator according to claim 6, wherein the substrate contains at least one element selected from the group consisting of Cr, Fe, Ti, and Si.

8. The method for manufacturing the piezoelectric actuator according to claim 1, wherein the piezoelectric material is PZT.

9. The method of claim 1, wherein the first annealing step is a process for a grain growth of the piezoelectric film and the second annealing step is a process for a correction of lattice defects.

10. The method of claim 1, wherein the treatment atmosphere of the first annealing step and the treatment atmosphere of the second annealing step are not controlled.

11. A method for manufacturing an ink jet head,
the ink jet head provided with an ink channel forming body having a plurality of pressure chambers each of which is provided with an opening in one surface side of the ink channel forming body and communicated with an ink discharge nozzle for discharging an ink, and a piezoelectric actuator having a vibration plate provided in the one surface side of the ink channel forming body to close the opening and a piezoelectric film formed on the vibration plate,
the method comprising the steps of:
forming the piezoelectric film by blowing an aerosol containing particles of a piezoelectric material on a surface of the vibration plate to adhere the particles to the vibration plate; and
annealing the piezoelectric film, wherein
the annealing step includes a first annealing step and a second annealing step conducted after the first annealing step and having an annealing temperature lower and an annealing time longer than those of the first annealing step,
wherein the piezoelectric film is substantially formed before the step of annealing, and
wherein a treatment atmosphere in which the vibration plate is disposed for conducting the first annealing step is not controlled to be different from a treatment atmosphere in which the vibration plate is disposed for conducting the second annealing step.

12. The method for manufacturing the ink jet head according to claim 11, further comprising, prior to the step of forming the piezoelectric film, the steps of:
forming the ink channel forming body, and
joining the vibration plate to the ink channel forming body.

13. The method for manufacturing the ink jet head according to claim 11, wherein, in the first annealing step, the annealing temperature is not less than 700° C. and the annealing time is not less than 1 minute to not more than 3 minutes.

14. The method for manufacturing the ink jet head according to claim 11, wherein, in the second annealing step, the annealing temperature is less than 500° C. to not more than 650° C. and the annealing time is not less than 10 minutes to not more than 30minutes.

15. The method for manufacturing the ink jet head according to claim 11, wherein, in the first annealing step, a temperature is raised to the annealing temperature at a temperature rise rate of not less than 800° C/min.

16. The method for manufacturing the ink jet head according to claim 11, wherein, in the first annealing step, a temperature of the treatment atmosphere is previously raised to the annealing temperature and then the vibration plate is disposed in the treatment atmosphere to conduct annealing.

17. The method for manufacturing the ink jet head according to claim 11, wherein the substrate is a metallic substrate.

18. The method for manufacturing the ink jet head according to claim 17, wherein the substrate contains at least one element selected from the group consisting of Cr, Fe, Ti, and Si.

19. The method for manufacturing the ink jet head according to claim 11, wherein the piezoelectric material is PZT.

20. The method of claim 11, wherein the treatment atmosphere of the first annealing step and the treatment atmosphere of the second annealing step are not controlled.

* * * * *